(12) United States Patent
Bao et al.

(10) Patent No.: US 10,102,822 B2
(45) Date of Patent: Oct. 16, 2018

(54) ARRAY SUBSTRATE, MANUFACTURING METHOD THEREOF, CONTROL METHOD, CONTROL ASSEMBLY, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhiying Bao, Beijing (CN); Wenbo Jiang, Beijing (CN); Shijun Wang, Beijing (CN); Zhenhua Lv, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/176,742

(22) Filed: Jun. 8, 2016

(65) Prior Publication Data
US 2016/0365069 A1    Dec. 15, 2016

(30) Foreign Application Priority Data

Jun. 10, 2015   (CN) .......................... 2015 1 0315475

(51) Int. Cl.
*G09G 5/10*    (2006.01)
*H01L 31/0224*   (2006.01)
(Continued)

(52) U.S. Cl.
CPC ............. *G09G 5/10* (2013.01); *H01L 27/12* (2013.01); *H01L 31/022408* (2013.01);
(Continued)

(58) Field of Classification Search
CPC ..... G09G 2360/144; G09G 2320/0626; G09G 2320/066
(Continued)

(56) References Cited

U.S. PATENT DOCUMENTS

2005/0156261 A1   7/2005 Nishikawa et al.
2007/0096636 A1*  5/2007 Park .................... H01L 27/3246
                                                   313/503

(Continued)

FOREIGN PATENT DOCUMENTS

CN           1645631 A     7/2005
CN         102354695 A     2/2012
(Continued)

OTHER PUBLICATIONS

The First Chinese Office Action dated May 18, 2017, Appln. No. 201510315475.4.

*Primary Examiner* — Koosha Sharifi-Tafreshi
(74) *Attorney, Agent, or Firm* — Ladas & Parry LLP

(57) ABSTRACT

An array substrate includes a base substrate, a thin film transistor and at least one photosensitive structure formed on the base substrate, the at least one photosensitive structure electrically connected to a drain electrode of the thin film transistor and configured to sense light intensity outside, and a common electrode formed on the base substrate on which the thin film transistor and the at least one photosensitive structure are formed. A method for manufacturing the array substrate, a control assembly and a display device are further disclosed.

2 Claims, 8 Drawing Sheets

(51) Int. Cl.
*H01L 31/113* (2006.01)
*H01L 31/153* (2006.01)
*H01L 31/18* (2006.01)
*H01L 33/00* (2010.01)
*H01L 33/02* (2010.01)
*H01L 27/12* (2006.01)
*H05B 33/14* (2006.01)
*G09G 3/34* (2006.01)

(52) U.S. Cl.
CPC ........ *H01L 31/1136* (2013.01); *H01L 31/153* (2013.01); *H01L 31/18* (2013.01); *H01L 33/0041* (2013.01); *H01L 33/02* (2013.01); *G09G 3/3406* (2013.01); *G09G 2300/0426* (2013.01); *G09G 2310/08* (2013.01); *G09G 2320/0626* (2013.01); *G09G 2360/144* (2013.01); *H01L 2933/0033* (2013.01); *H05B 33/145* (2013.01)

(58) Field of Classification Search
USPC .............................. 345/207, 690, 102, 77, 76
See application file for complete search history.

(56) References Cited

U.S. PATENT DOCUMENTS

| | | |
|---|---|---|
| 2012/0194493 A1 | 8/2012 | Soto |
| 2012/0205646 A1 | 8/2012 | Cho et al. |
| 2012/0293475 A1 | 11/2012 | Sugita et al. |
| 2015/0145840 A1* | 5/2015 | Lim .................... H01L 27/1446 345/207 |

FOREIGN PATENT DOCUMENTS

| | | |
|---|---|---|
| CN | 102622970 A | 8/2012 |
| CN | 102667905 A | 9/2012 |
| JP | 2008-191822 A | 8/2008 |

* cited by examiner

Forming a thin film transistor and at least one photosensitive structure on a base substrate, the photosensitive structure electrically connected with a drain electrode of the thin film transistor Forming a common electrode on the base substrate on which the thin film transistor and at least one photosensitive structure are formed

ARRAY SUBSTRATE, MANUFACTURING METHOD THEREOF, CONTROL METHOD, CONTROL ASSEMBLY, AND DISPLAY DEVICE

TECHNICAL FIELD

Embodiments of the present disclosure relate an array substrate, a manufacturing method thereof, a control method, a control assembly and a display device.

BACKGROUND

In recent years, with rapid development of mobile electronic devices such as cell phone, people demands more and more on various functions of display device, for example, auto-brightness adjustment of display device, which is considered as a commonly used one.

Relevant arts disclosed a display device (such as a cell phone), on a housing of which a photosensitive unit is mounted. The photosensitive unit senses light intensity outside, and feed the light intensity back to a control component, which control light intensity of backlight source according to the light intensity, so as to adjust display brightness of the display device.

In the manner of controlling light intensity of backlight source as described above, the display device can sense light intensity outside through a photosensitive unit mounted outside and adjust display brightness according to the light intensity outside, so as to obtain auto-brightness adjustment. However, the cost is high.

SUMMARY

An embodiment of the present disclosure provides an array substrate, comprising: a base substrate; a thin film transistor formed on the base substrate; and a photosensitive structure, which is connected with a drain electrode of the thin film transistor and configured to sense light intensity outside; wherein the array substrate further comprises a common electrode, which is formed on the base substrate.

In one embodiment of the present disclosure, the photosensitive structure comprises a photosensitive layer and a photosensitive electrode, wherein the photosensitive electrode is formed on the base substrate on which the thin film transistor is formed, the photosensitive electrode is connected with a drain electrode of the thin film transistor; the photosensitive layer is formed on the photosensitive electrode; and the common electrode is formed on the photosensitive layer.

At least one embodiment of the present disclosure provides a manufacturing method of an array substrate, which comprises:

forming a thin film transistor and a photosensitive structure on a base substrate, wherein the photosensitive structure is connected with a drain electrode of the thin film transistor; and forming a pattern of common electrode on the base substrate on which the thin film transistor and the photosensitive structure are formed.

At least one embodiments of the present disclosure provides a control method for an array substrate, the array substrate comprising a base substrate, a thin film transistor, a photosensitive structure and a common electrode formed on the base substrate, wherein the photosensitive structure is connected with a drain electrode of the transistor, the method comprising:

stopping inputting a signal to a source electrode of the thin film transistor;

sensing light intensity outside and generating a photocurrent;

receiving the photocurrent flowing through a drain electrode and a source electrode of the thin film transistor; and controlling display brightness on basis of the photocurrent.

At least one embodiment of the present disclosure provides a control assembly configured to control an array substrate, the array substrate comprising a thin film transistor, a photosensitive structure and a common electrode, the control assembly comprising:

a stop module, configured to stop inputting a signal to a source electrode of the thin film transistor, the photosensitive structure configured to sense light intensity outside and generate a photocurrent;

a receiving module, configured to receiving the photocurrent flowing through a drain electrode and a source electrode of the thin film transistor; and a control module, configured to adjust display brightness on basis of the photocurrent.

At least one embodiment of the present disclosure provides a display device, which comprises the array substrate as described above.

At least one embodiment of the present disclosure provides a display device, which comprises the control assembly as described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 2-1 is an illustrative structural view of an array substrate according to another embodiment of the present disclosure;

FIG. 2-2 is an illustrative structural view of the array substrate as illustrated in FIG. 2-1, wherein a photosensitive structure is not formed on the array substrate;

FIG. 2-3 is a top view of the array substrate as illustrated in FIG. 2-1;

FIG. 2-4 is a equivalent schematic circuit diagram of the array substrate as illustrated in FIG. 2-1;

FIG. 2-5 is an illustrative structural view of an array substrate according to another embodiment of the present disclosure;

FIG. 3-1 is a flow chart of a manufacturing method of an array substrate according to one embodiment of the present disclosure;

FIG. 3-2 is an illustrative structural view of a base substrate manufactured by the manufacturing method according to the embodiment as illustrated in FIG. 3-1;

FIG. 4-1 is a flow chart of a manufacturing method of an array substrate according to one embodiment of the present disclosure;

FIG. 4-2 to FIG. 4-7 are illustrative structural views of a base substrate manufactured by the manufacturing method according to the embodiment as illustrated in FIG. 4-1;

FIG. 5-1 is a flow chart of a control method for an array substrate according to one embodiment of the present disclosure;

FIG. 5-2 is a flow chart of controlling display brightness in the control method for the array substrate according to the embodiment as illustrated in FIG. 5-1; and FIG. 6 is a block diagram of a control assembly according to one embodiment of the present disclosure.

| Reference Signs: | |
| --- | --- |
| 101 base substrate | 120 thin film transistor |
| 121 drain electrode of thin film transistor | 130 photosensitive structure |
| 131 photosensitive layer | 132 photosensitive electrode |
| 140 common electrode | 150 light emitting structure |
| 160 pixel electrode | 170 insulating layer |
| G-gate electrode   S-source electrode | D-drain electrode |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
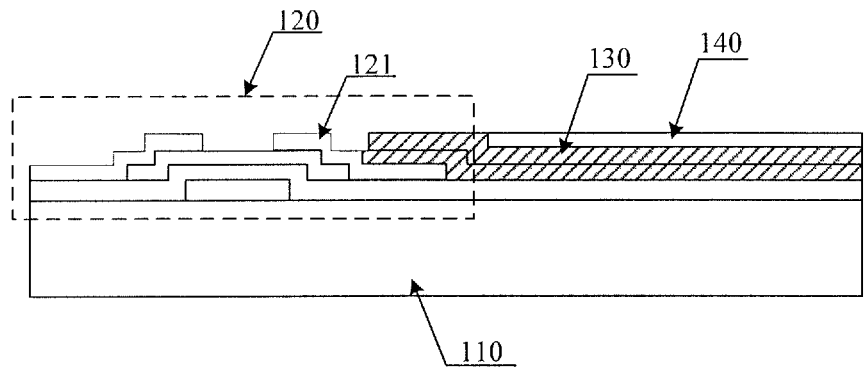
FIG. 1 is an illustrative structural view of an array substrate according to one embodiment of the present disclosure.

FIG. 1 is an illustrative structural view of an array substrate according to one embodiment of the present disclosure. The array substrate comprising: a base substrate 110; a thin film transistor 120 formed on the base substrate 110; and at least one photosensitive structure 130, formed on the base substrate 110; wherein the at least one photosensitive structure 130 is electrically connected with a drain electrode 121 of the thin film transistor 120 and is configured to sense light intensity outside.

The array substrate further comprises a common electrode 140, formed on the substrate 110 on which the thin film transistor 120 and the at least one photosensitive structure 130 are formed.

In the array substrate according to the embodiment of the present disclosure, light intensity outside is sensed by the photosensitive structure formed on the array substrate. Thus, light intensity outside is not required to be sensed by a light sensing unit mounted outside, as does conventional techniques, and cost for obtaining auto-brightness adjustment of display is reduced.

Figures 1, 2:
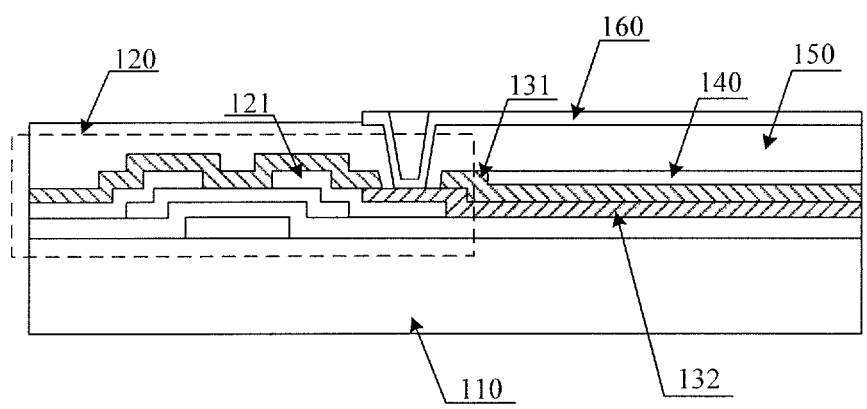
Figure 2:
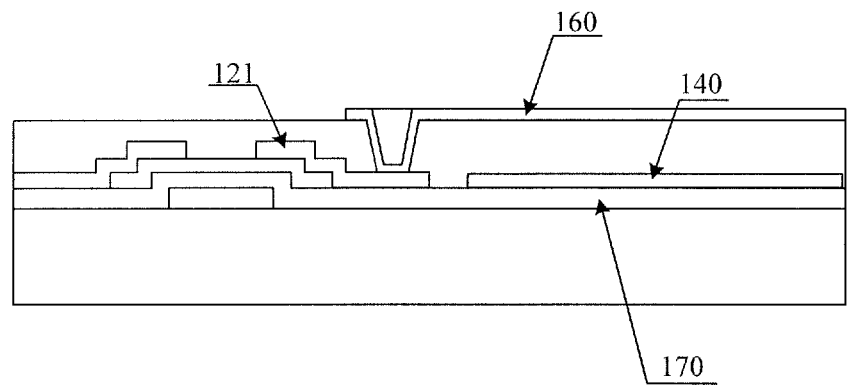

And further, please refer to FIG. 2-1, which illustrate an illustrative structure view of an array substrate according to another embodiment of the present disclosure. The array substrate is a variant of the array substrate as illustrated in FIG. 1, wherein a photosensitive structure comprises a photosensitive layer 131 and a photosensitive electrode 132, which forms together the photosensitive structure 130 as illustrated in FIG. 1.

As illustrate in FIG. 2-1, a photosensitive electrode 132 is formed on the base substrate 110 on which the thin film transistor 120 is formed, and the photosensitive electrode 132 is electrically connected with a drain electrode 121 of the thin film transistor 120.

The photosensitive layer 131 is formed on the photosensitive electrode 132, and the common electrode 140 is formed on the photosensitive layer 131. The photosensitive layer 131 may be formed in a region over the thin film transistor 120, and the photosensitive layer 131 may not be formed in a region over the thin film transistor 120, which is not limited herein. If the photosensitive layer 131 is formed in a region over the thin film transistor 120, an insulating layer is formed between the thin film transistor 120 and the photosensitive layer 131 so as to protect the thin film transistor 120.

In one embodiment of the present disclosure, the photosensitive layer 131 is formed of a material comprising at least one of photosensitive resin and photosensitive polymer.

In one embodiment of the present disclosure, a light emitting structure 150 is formed on the common electrode 140.

A pixel electrode 160 can be formed on the light emitting structure 150. The pixel electrode 160 is electrically connected with a drain electrode 121 of the thin film transistor 120. The light emitting structure 150 may be formed in a region over the thin film transistor 120, and may not be formed in a region over the thin film transistor 120, which is not limited in the present disclosure.

In one embodiment of the present disclosure, the pixel electrode 160 can be electrically connected with the photosensitive electrode 132 via a through hole. As the photosensitive electrode 132 is electrically connected with the drain electrode 121, the pixel electrode 160 can be electrically connected with the drain electrode 121. And if the pixel electrode 160 is electrically connected with the photosensitive electrode, the pixel electrode 160 is not in contact with the photosensitive layer 131.

In one embodiment of the present disclosure, the light emitting structure 150 is a three-layered electroluminescence structure or a five-layered electroluminescence structure.

If the light emitting structure 150 is a three-layered electroluminescence structure, it comprises a cathode, an electroluminescence layer and an anode.

If the light emitting structure 150 is a five-layered electroluminescence structure, it comprises a cathode, an electroluminescence layer, an ion conductor layer, an ion storage layer and an anode.

In the array substrate according to one embodiment of the present disclosure, the photosensitive structure can be disposed in a portion of a pixel region. For example, pixels in any one to four columns are provided with a photosensitive structure, while other pixels are not provided with photosensitive structure. Structure of a portion of the array substrate which is not provided photosensitive structure is illustrated in FIG. 2-2, wherein the pixel electrode 160 is directly electrically connected with the drain electrode 121 and the common electrode 140 is formed on the insulating layer 170. A top view of the array substrate according to this embodiment of the present disclosure is illustrated in FIG. 2-3, wherein the photosensitive layer, the light emitting structure and the pixel electrode are not shown, a common signal line 210 is connected with the common electrode 140 so as to supply electrical signals to the common electrode 140, and the data line 220 is electrically connected with the drain electrode of the thin film transistor 120.

Figures 2, 3:
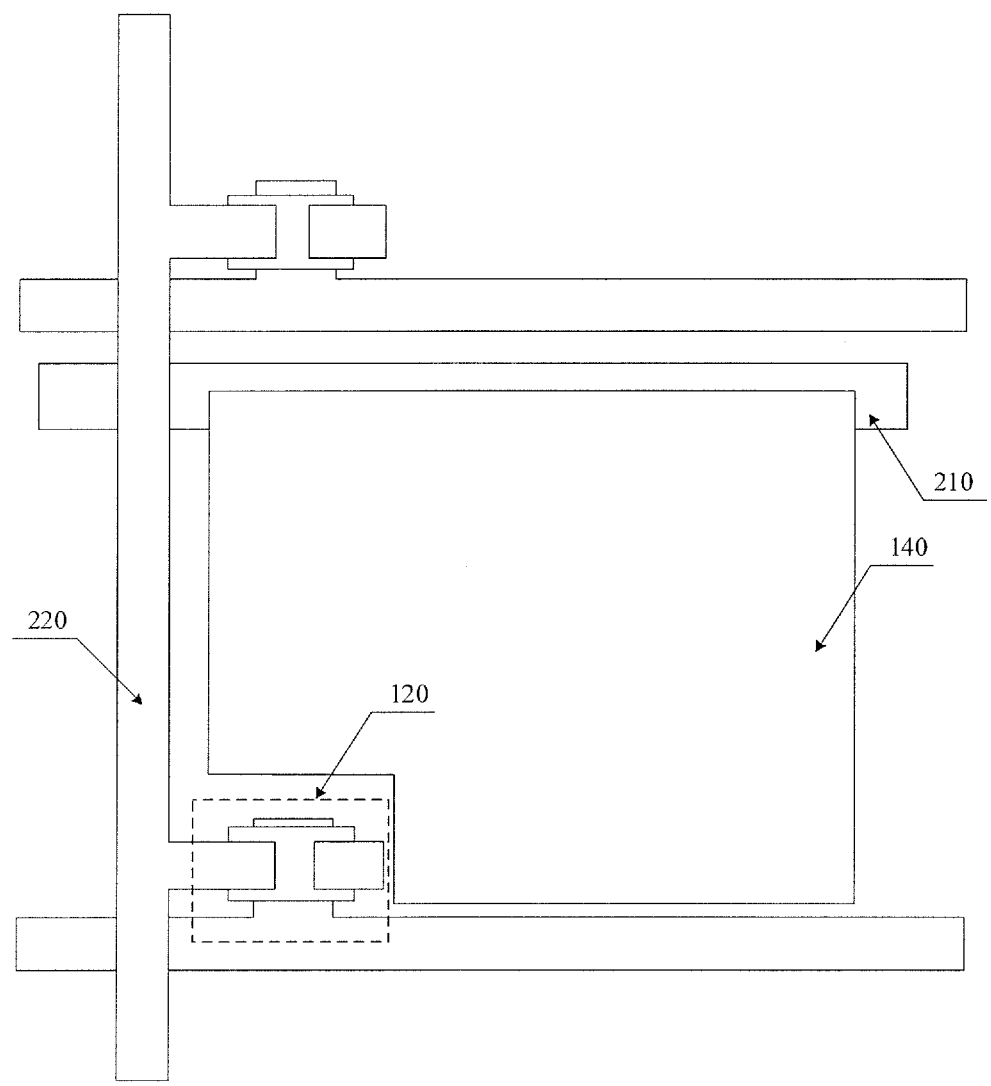
Figures 2, 3, 4:
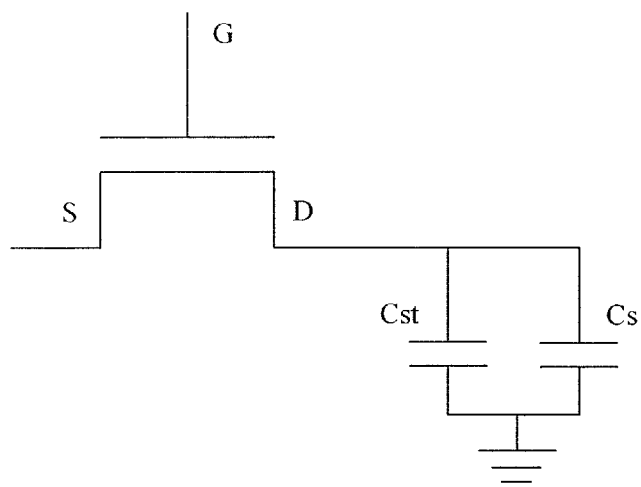

FIG. 2-4 illustrates a equivalent schematic circuit diagram of the array substrate according to one embodiment of the present disclosure, wherein G is a gate electrode, S is a source electrode and D is a drain electrode, Cst refers to the capacitance between the pixel electrode and the common electrode, Cs refers to the capacitance between the photosensitive electrode and the common electrode, and the Cst is connected with the Cs in parallel. The Cst is included in conventional arts, while the array substrate further comprises a Cs with respect to the conventional arts, which enlarge the storage capacitance, thus facilitating holding voltage of the pixel, and mitigating defects in image quality due to leakage current (a current flowing through the thin film transistor when the thin film transistor is OFF).

FIG. 2-5 illustrates structure of an array substrate according to one embodiment of the present disclosure, wherein shapes of a light emitting structure 150 and the photosensitive layer 131 are formed through a patterning process so as to make the pixel electrode 160 electrically connected with the photosensitive electrode 132. The pixel electrode 160 and the photosensitive layer 131 are not formed over the thin film transistor 120, and a portion of the photosensitive electrode 132 is not overlapped by the pixel electrode 160 and the photosensitive layer 131. Then, the pixel electrode 160 formed on the light emitting structure 150 can be directly electrically connected with the photosensitive electrode 132 or the drain electrode 121.

It should be noted that, in the array substrate according to embodiments of the present disclosure, a light emitting structure formed on the base substrate can obtain an effect that the array substrate can emit light itself.

According to one embodiment of the present disclosure, operation state of the array substrate comprising a photosensitive structure comprises a photo sensing stage and a display stage. Light intensity outside is sensed before displaying image, so as to adjust display brightness according to light intensity outside. The photo sensing stage has a very short duration, for example, several milliseconds, so as to not affect normal display. In order to sense light intensity outside, inputting signals to the source electrode of the thin film transistor is stopped. Thereafter, the photosensitive structure generates photocurrent under effect of the light from outside. Amplitude of the generated photocurrent is proportional to light intensity outside. The photocurrent can flow reversely (that is, flowing in a direction opposite to the direction of driving current), from the drain electrode to the source electrode. The light intensity outside can be determined on basis of the amplitude of the photocurrent, and the display brightness can be controlled on basis of the light intensity outside, such as controlling brightness of the backlight source.

As described above, in the array substrate according to embodiments of the present disclosure, a photosensitive structure is formed on the array substrate so as to sense light intensity outside. With respective conventional techniques, it is not required to mount a photosensitive unit outside to sense light intensity outside, thus reducing cost of obtaining auto adjustment for display brightness.

FIG. 3-1 is a flow chart of a manufacturing method of an array substrate according to one embodiment of the present disclosure, the manufacturing method comprising:

forming a thin film transistor and at least one photosensitive structure on a base substrate, the at least one photosensitive structure electrically connected with a drain electrode of the thin film transistor; and forming a pattern comprising a common electrode 140 on the base substrate on which the thin film transistor and the at least one photosensitive structure are formed.

After forming a thin film transistor and at least one photosensitive structure on a base substrate, a structure of the base substrate is illustrated in FIG. 3-2, wherein the thin film transistor 120 and the photosensitive structure 130 are formed on the base substrate 110, and the photosensitive structure 130 is electrically connected with the drain electrode 121 of the thin film transistor 120.

After forming the pattern comprising the common electrode 140 on the base substrate on which the thin film transistor and the at least one photosensitive structure are formed, the structure of the array substrate as illustrated in FIG. 1 is obtained.

As described above, in the manufacturing method of array substrate according to the embodiment of the present disclosure, a photosensitive structure is formed on the array substrate and is configured to sense light intensity outside. Thus, light intensity outside is not required to be sensed by a light sensing unit mounted outside, as conventional techniques do, and cost for obtaining auto-brightness adjustment of display is reduced.

FIG. 4-1 is a flow chart of a manufacturing method of an array substrate according to another embodiment of the present disclosure, the method comprising:

forming a thin film transistor on a base substrate;

forming a pattern comprising a photosensitive electrode on the base substrate on which the thin film transistor is formed, wherein the photosensitive electrode is electrically connected with a drain electrode of the thin film transistor;

forming a photosensitive layer on the photosensitive electrode, wherein the photosensitive electrode and the photosensitive layer form a photosensitive structure;

forming a pattern comprising a common electrode on the base substrate on which the thin film transistor and the photosensitive structure are formed;

forming a light emitting structure on the common electrode; and forming a patterning comprising a pixel electrode, wherein the pixel electrode is electrically connected with a drain electrode of the thin film transistor.

After forming the thin film transistor on the base substrate, the structure of the base substrate is illustrated in FIG. 4-2, wherein the thin film transistor 120 and the insulating layer 170 are formed on the base substrate.

After forming the pattern comprising a photosensitive electrode on the base substrate on which the thin film transistor is formed, the resultant structure of the base substrate is illustrated in FIG. 4-3, wherein the photosensitive electrode 132 is electrically connected with the drain electrode 121 of the thin film transistor 120.

In one embodiment of the present disclosure, material for the photosensitive layer comprises at least one of photosensitive resin and photosensitive polymer.

Figures 2, 3, 4, 5:
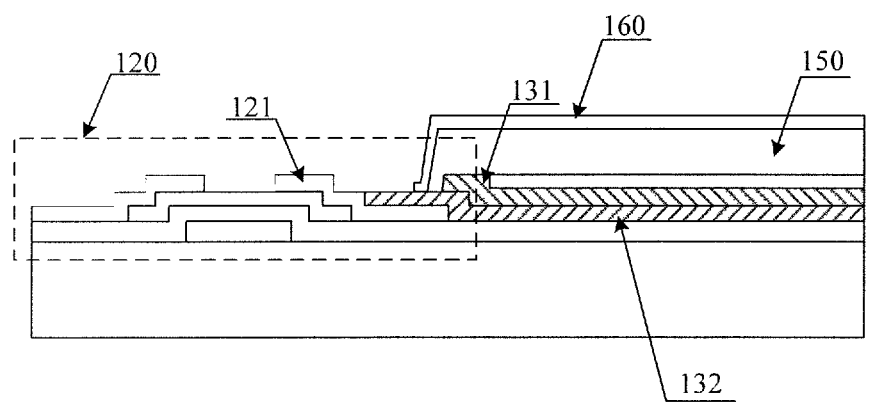
Figures 1, 3:
Figures 2, 3:
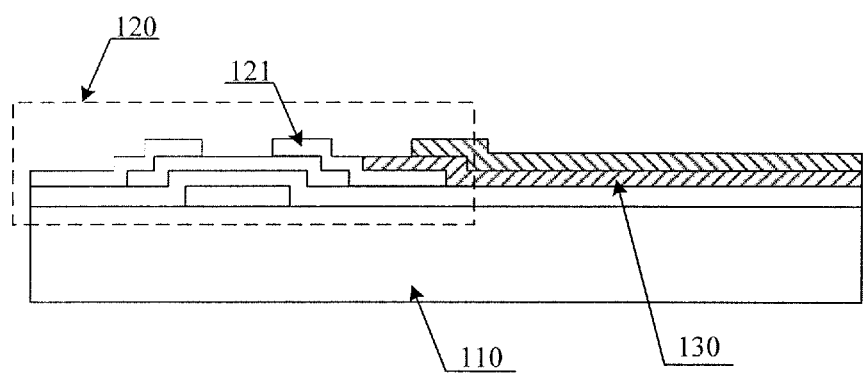

After forming a photosensitive layer on the photosensitive electrode, the resultant structure of the base substrate is illustrated in FIG. 4-4, wherein the photosensitive layer 131 is formed on the photosensitive electrode. In the structure as illustrated in FIG. 4-4, if the photosensitive layer 131 is formed on the thin film transistor 120, an insulating layer (not shown in the FIG. 4-4) can be formed between the thin film transistor and the photosensitive layer 131 so as to protect the thin film transistor 120. Optionally, the photosensitive layer 131 is not formed on the thin film transistor 120. It should be noted that, the pixel electrode can be electrically connected with the photosensitive electrode 132 via a through hole. Then, after forming a photosensitive layer on the photosensitive electrode, a first through hole k1 is formed in the photosensitive layer 131, and the resultant structure of the array substrate is illustrated in FIG. 4-5, wherein the same reference signs refer to the similar structure as illustrated in FIG. 4-4.

In one embodiment of the present disclosure, the common electrode is formed on the photosensitive layer.

Optionally, the light emitting structure can be a three-layered electroluminescence structure or a five-layered electroluminescence structure.

If the light emitting structure is a three-layered electroluminescence structure, it comprises a cathode, an electroluminescence layer, and an anode. And if the light emitting structure is a five-layered electroluminescence structure, it comprises a cathode, a electroluminescence layer, an ion conductor layer, an ion storage layer and an anode.

Figures 1, 4:
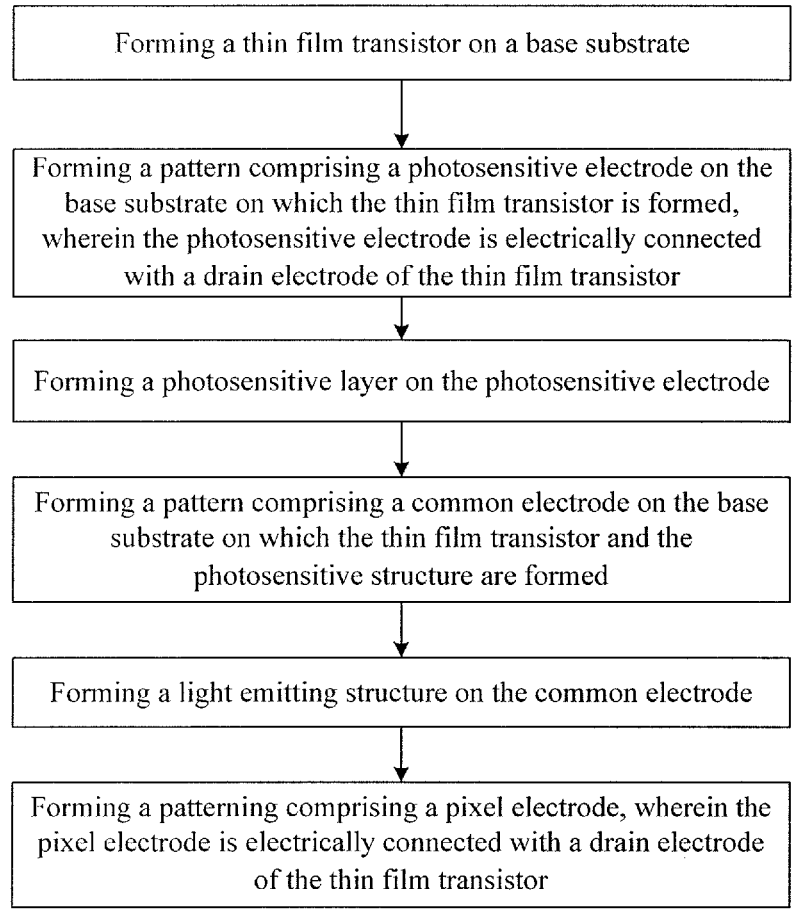
Figures 2, 4:
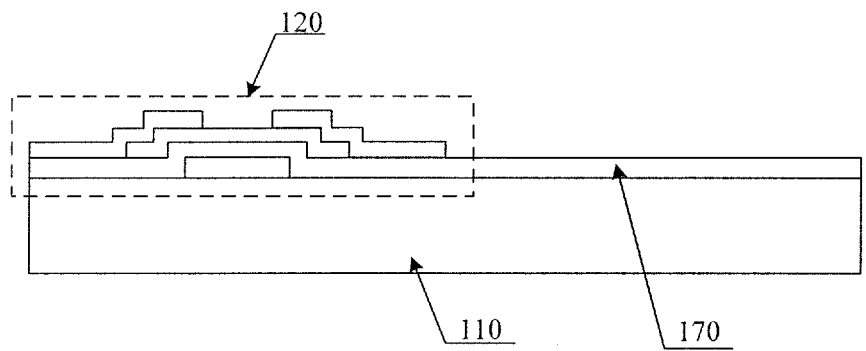
Figures 3, 4:
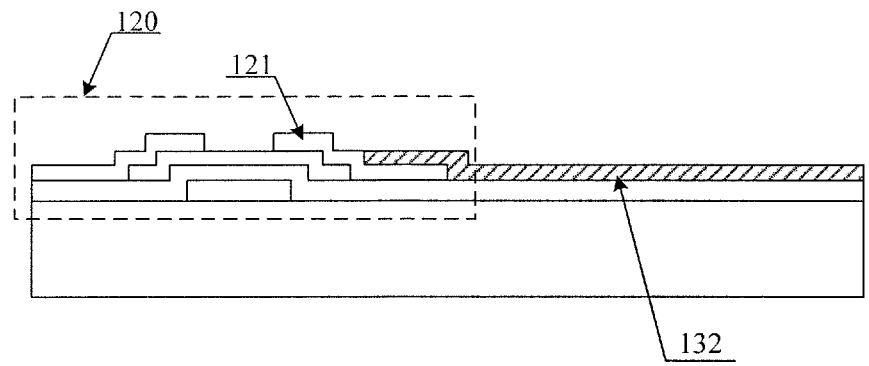
Figure 4:
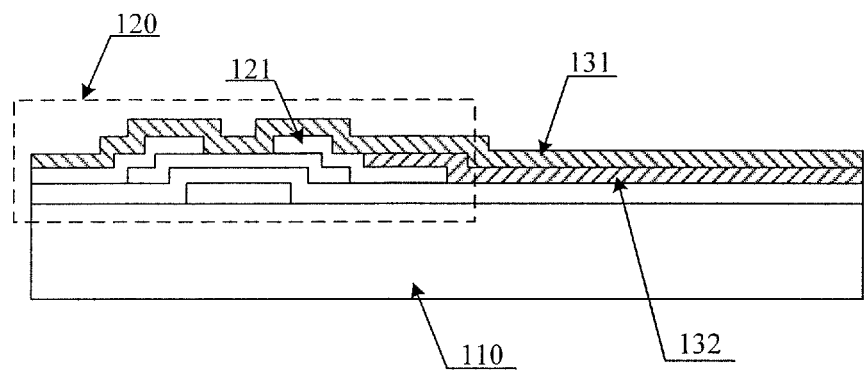
Figures 4, 5:
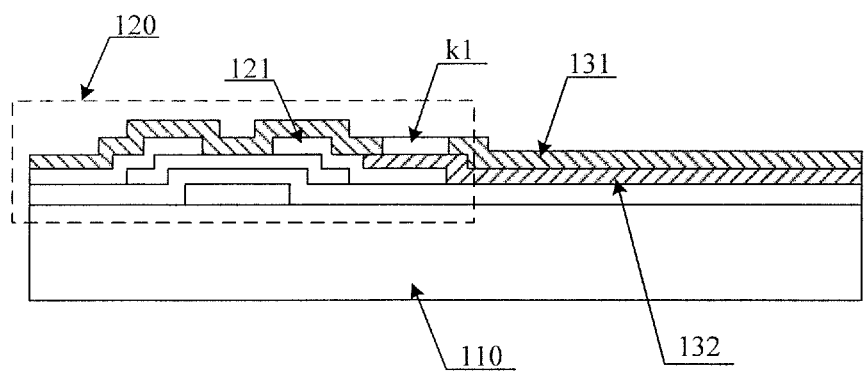
Figures 4, 5, 6:
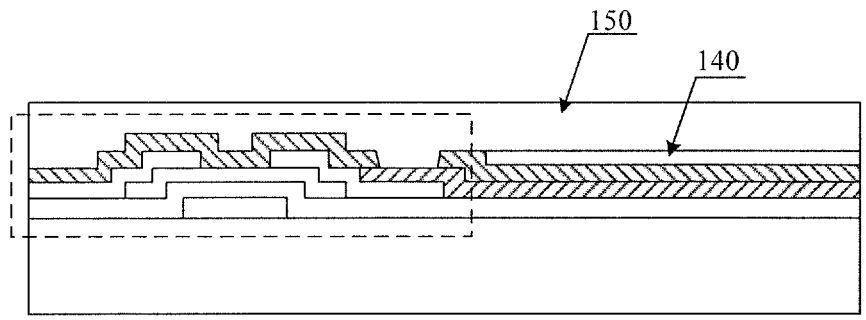
Figures 4, 5, 6, 7:
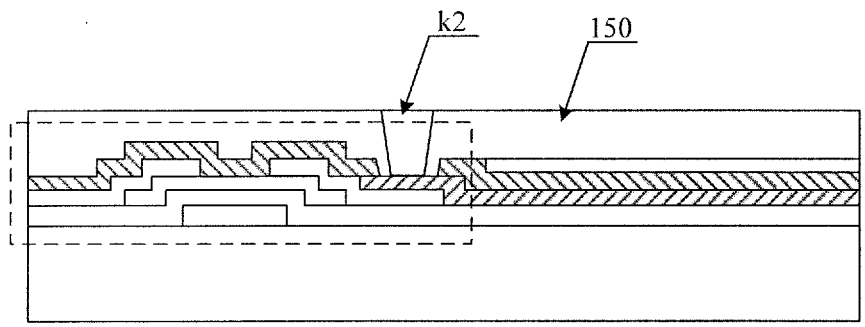
Figures 1, 5:
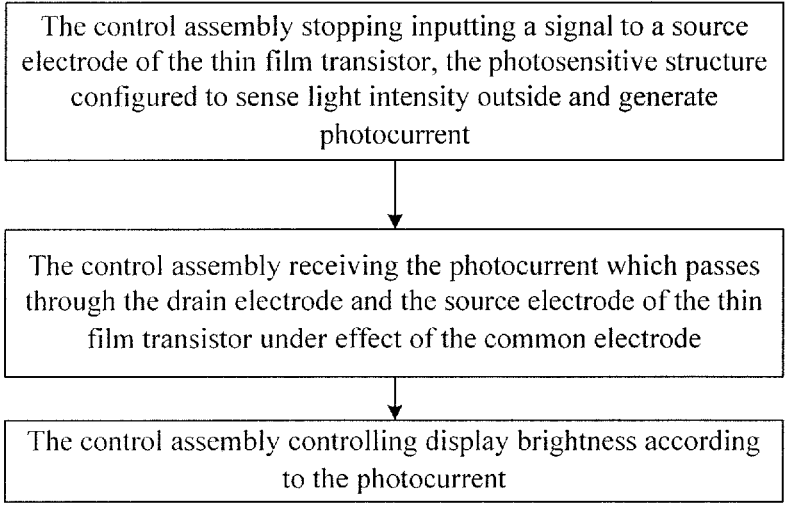
Figures 2, 5:
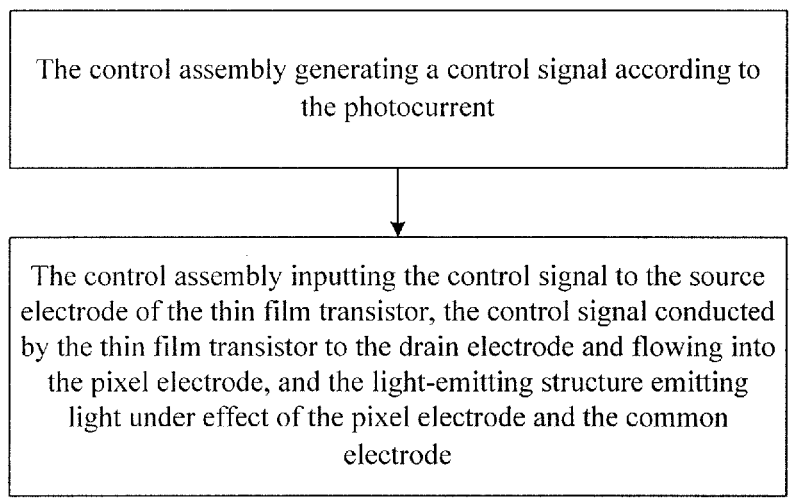
Figure 6:
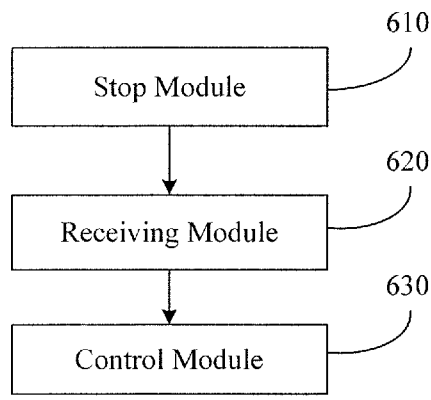

After forming a light emitting structure on the common electrode, the resultant structure of the array substrate is as illustrated in FIG. 4-6, wherein the light emitting structure 160 is formed on the common electrode 140.

Optionally, the pixel electrode is electrically connected with the photosensitive electrode via a through hole. As illustrated in FIG. 4-7, after forming a light emitting structure on the common electrode, a second through hole k2 is formed in the light emitting layer, the radius of the second through hole k2 is less than the radius of the first through hole k1.

After forming a patterning comprising a pixel electrode, the resultant structure of the base substrate is as illustrated in FIG. 2-1. As the radius of the second through hole k2 is less than the radius of the first through hole k1, the pixel electrode 160 will not be in contact with the photosensitive layer 131, thus mutual influence between the pixel electrode 160 and the photosensitive layer 131.

It should be noted that, in the manufacturing method of array substrate according to embodiments of the present disclosure, a light emitting structure is formed on the base substrate, thus the array substrate can emit light itself.

As described above, in the manufacturing method of array substrate according to the embodiment of the present disclosure, a photosensitive structure is formed on the array substrate and is configured to sense light intensity outside. Thus, light intensity outside is not required to be sensed by a light sensing unit mounted outside, as conventional techniques do, and cost for obtaining auto-brightness adjustment of display is reduced.

FIG. 5-1 is a flow chart of a control method for an array substrate according to one embodiment of the present disclosure, the method is adapted to a control assembly, which is configured to control the array substrate according to the embodiment as illustrated in FIG. 1, or to control the array substrate according to the embodiment as illustrated in FIG. 2, the array substrate comprising a thin film transistor, a photosensitive structure, and a common electrode, wherein the method comprises:

the control assembly stopping inputting a signal to a source electrode of the thin film transistor, the photosensitive structure configured to sense light intensity outside and generate photocurrent;

the control assembly receiving the photocurrent which pass through the drain electrode and the source electrode of the thin film transistor under effect of the common electrode; and the control assembly controlling display brightness according to amplitude of the photocurrent.

After stopping inputting a signal to the source electrode of the thin film transistor, the photocurrent generated by the photosensitive structure can flow reversely into the control assembly through the source electrode. It should be noted that, period of stopping inputting signals to the source electrode of the thin film transistor can be taken as a photosensitive stage and other periods can be taken as a display stage. The photosensitive stage can be very short (for example, several milliseconds), thus, normal display will not be affected.

In order to make the photocurrent generated by the photosensitive flow to the drain electrode more easily, the common electrode can be applied a preset negative voltage.

After receiving the photocurrent, the control assembly can sense light intensity outside at present on basis of the photocurrent, and control display brightness according to the light intensity outside, for example, by controlling brightness of the backlight source.

Optionally, the array substrate further comprises a light emitting structure and a pixel electrode.

In such a case, as illustrated in FIG. 5-2, the control assembly controlling the display brightness according to the photocurrent can comprise:

the control assembly generating a control signal according to the photocurrent; and the control assembly inputting the control signal to the source electrode of the thin film transistor, the control signal conducted by the thin film transistor to the drain electrode and flowing to the pixel electrode, and the light-emitting structure emitting light under effect of the pixel electrode and the common electrode.

If the array substrate comprises a light emitting structure, the control assembly can directly generate a control signal for controlling the light emitting structure, which can make the light emitting structure emit light with required brightness (for example, a brightness suitable for human eyes).

It should be noted that, in the control method for an array substrate according to an embodiment of the present disclosure, the control assembly just needs to output two timing signals (one for controlling the photosensitive stage, and the other for controlling the display stage). Thus, the control assembly can be provided with two Electrically Erasable Programmable Read-Only Memories (EEPROM), which are configured to output timing signals for controlling the photosensitive stage and the display stage respectively.

It should be noted that, in the control method for an array substrate according to an embodiment of the present disclosure, the effect of adjusting display brightness by controlling the array substrate is obtained through controlling light emitted from the light emitting structure disposed on the array substrate.

As described above, in the manufacturing method of array substrate according to the embodiment of the present disclosure, a photosensitive structure is formed on the array substrate and is configured to sense light intensity outside. Thus, light intensity outside is not required to be sensed by a light sensing unit mounted outside, as conventional techniques do, and cost for obtaining auto-brightness adjustment of display is reduced.

FIG. 6 illustrates a control assembly according to an embodiment of the present disclosure. The control assembly is configured to control the array substrate according to the embodiment illustrated in FIG. 1 or the array substrate according to the embodiment illustrated in FIG. 2-1. The array substrate can comprise a thin film transistor, a photosensitive structure and a common electrode. The control assembly comprises:

a stopping module 610, configured to stop inputting a signal to a source electrode of the thin film transistor, the photosensitive structure configured to sense light intensity outside and generate a photocurrent;

a receiving module 620, configured to receive the photocurrent flowing through a drain electrode and the source electrode of the thin film transistor under effect of the common electrode; and a control module 630, configured to control display brightness on basis of the photocurrent.

Optionally, the control module 630 is configured to generate a control signal on basis of the photocurrent and input the control signal to the source electrode of the thin film transistor, and then, the control signal is conducted to the drain electrode of the thin film transistor and flows into the pixel electrode, the light emitting structure emits light under effect of a pixel electrode and the common electrode.

It should be noted that, the control assembly according to the embodiment of the present disclosure controls the light emitting structure disposed on the array substrate to emit light, thus achieving an effect of adjusting display brightness by controlling the array substrate.

As described above, in the control assembly according to the embodiment of the present disclosure, a photosensitive structure is formed on the array substrate and is configured to sense light intensity outside. Thus, light intensity outside is not required to be sensed by a light sensing unit mounted outside, as conventional techniques do, and cost for obtaining auto-brightness adjustment of display is reduced.

At least one embodiment of the present disclosure further provides a display device, which comprises the array substrate according to the embodiment illustrated in FIG. 1 or the array substrate according to the embodiment illustrated in FIG. 2-1.

At least one embodiment of the present disclosure further provides a display device, which comprises the control assembly as illustrated in FIG. 6.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510315475.4 filed on Jun. 10, 2015, the disclosure of which is hereby entirely incorporated by reference.

What is claimed is:

1. A control method adapted to control an array substrate, the array substrate, comprising:
    a base substrate;
    a thin film transistor formed on the base substrate; and
    at least one photosensitive structure formed on the base substrate, wherein the at least one photosensitive structure is electrically connected to a drain electrode of the thin film transistor and is configured to sense light intensity outside; and
    wherein the array substrate further comprises a common electrode formed on the base substrate on which the thin film transistor and the at least one photosensitive structure are formed;
    the control method comprising:
        stopping inputting a signal to a drain electrode of the thin film transistor, the photosensitive structure being configured to sense light intensity outside and to generate a photocurrent;
        receiving a photocurrent flowing through the drain electrode and a source electrode of the thin film transistor under effect of the common electrode; and
        controlling display brightness according to the photocurrent,
    wherein the array substrate further comprises a light emitting structure and a pixel electrode;
    controlling the display brightness according to the photocurrent comprises:
        generating a control signal according to the photocurrent;
        inputting a control signal to the source electrode of the thin film transistor, and inputting the control signal into the pixel electrode through the source electrode and the drain electrode of the thin film transistor; and
        allowing the light emitting structure to emit light under effect of the pixel electrode and the common electrode.

2. A control method adapted to a control assembly, the control assembly configured to control an array substrate, the array substrate, comprising:
    a base substrate;
    a thin film transistor formed on the base substrate; and
    at least one photosensitive structure formed on the base substrate, wherein the at least one photosensitive structure is electrically connected to a drain electrode of the thin film transistor and is configured to sense light intensity outside; and
    wherein the array substrate further comprises a common electrode formed on the base substrate on which the thin film transistor and the at least one photosensitive structure are formed;
    the control method comprising:
        the control assembly stopping inputting a signal to a source of the thin film transistor, the photosensitive structure configured to sense light intensity outside and generate a photocurrent;
        the control assembly receiving the photocurrent flowing through a drain electrode and a source electrode of the thin film transistor under effect of the common electrode; and
        the control assembly adjusting display brightness according to the photocurrent,
    wherein the array substrate further comprises a light emitting structure and a pixel electrode, and
    the control assembly controlling the display brightness according to the photocurrent comprises:
        the control assembly generating a control signal according to the photocurrent; and
        the control assembly inputting the control signal to a source electrode of the thin film transistor, the control signal conducted to a drain electrode of the thin film transistor by the source electrode of the thin film transistor and flowing into the pixel electrode, the light emitting structure emitting light under effect of the pixel electrode and the common electrode.

\* \* \* \* \*